(12) United States Patent
Muraoka

(10) Patent No.: US 7,385,264 B2
(45) Date of Patent: Jun. 10, 2008

(54) METHOD OF FORMING SEMICONDUCTOR DEVICE AND SEMICONDUCTOR DEVICE

(75) Inventor: Kouichi Muraoka, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/401,967

(22) Filed: Mar. 31, 2003

(65) Prior Publication Data
US 2004/0018690 A1   Jan. 29, 2004

(30) Foreign Application Priority Data
Mar. 29, 2002 (JP) .............................. 2002-094150

(51) Int. Cl.
H01L 29/78 (2006.01)

(52) U.S. Cl. ...................... 257/410; 257/411

(58) Field of Classification Search ............... 257/410, 257/411, 324, 325; 438/216, 591
See application file for complete search history.

(56) References Cited

U.S. PATENT DOCUMENTS

| 4,492,110 | A | * | 1/1985 | Bergquist | ................... | 73/40.7 |
| 5,360,768 | A | | 11/1994 | Ohmi et al. | | |
| 6,051,865 | A | * | 4/2000 | Gardner et al. | ............. | 257/411 |
| 6,429,496 | B1 | * | 8/2002 | Li et al. | ...................... | 257/411 |
| 6,504,214 | B1 | * | 1/2003 | Yu et al. | ..................... | 257/347 |
| 6,531,364 | B1 | * | 3/2003 | Gardner et al. | ............. | 438/287 |
| 6,674,138 | B1 | * | 1/2004 | Halliyal et al. | ............. | 257/411 |
| 6,800,519 | B2 | * | 10/2004 | Muraoka et al. | ............. | 438/216 |
| 6,831,339 | B2 | * | 12/2004 | Bojarczuk et al. | .......... | 257/411 |
| 7,005,717 | B2 | * | 2/2006 | Eisenbeiser et al. | ........ | 257/410 |
| 2003/0057504 | A1 | * | 3/2003 | Muraoka et al. | ............. | 257/410 |
| 2004/0018690 | A1 | * | 1/2004 | Muraoka | .................... | 438/300 |

FOREIGN PATENT DOCUMENTS

| JP | 61-35548 | 2/1986 |
| JP | 3122125 | 5/1990 |
| JP | 4-145624 | 5/1992 |
| JP | 11-162971 | 6/1999 |
| JP | 2001-127280 | 5/2001 |
| JP | 2001-160555 | 6/2001 |
| JP | 2001-284344 | 10/2001 |
| JP | 2001-284582 | 10/2001 |
| JP | 2002-83960 | 3/2002 |

OTHER PUBLICATIONS

English language translation of Japanese publication 2003-101014 (which corresponds to Japanese application 2001-295367).*
Journal of Applied Physics, vol. 87, No. 10, pp. 7338-7341, "Pressure dependence of Si/SiO2 degradation suppression by helium," by Afanas'ev et al., May 2000.*

(Continued)

Primary Examiner—Mark Prenty
(74) Attorney, Agent, or Firm—Oblon, Spivak, McClelland, Maier & Neustadt, P.C.

(57) ABSTRACT

The present invention provides a semiconductor device having an improved silicon oxide film as a gate insulation film of a Metal Insulator Semiconductor structure and a method of making the same.

4 Claims, 6 Drawing Sheets

OTHER PUBLICATIONS

JP90-506699; Morita, M; Ohmi, T; Forming oxide film—by contacting soln. of oxygen with substrate and heat treating.; (English Abstract correlating to U.S. 5,360, 768), May 1991.

"Periodic Table", Natural Science Research Mechanism Okazaki Common Research Facility Calculation Science Research Center Publication Service, search Feb. 2, 2006, Internet <URL: http://ccinfo.ims.ac.jp/service/index.html>.

Watanabe et al, Applied Physics Letters, (2002) vol. 80, No. 4, pp. 559-561.

* cited by examiner

*FIG. 1*
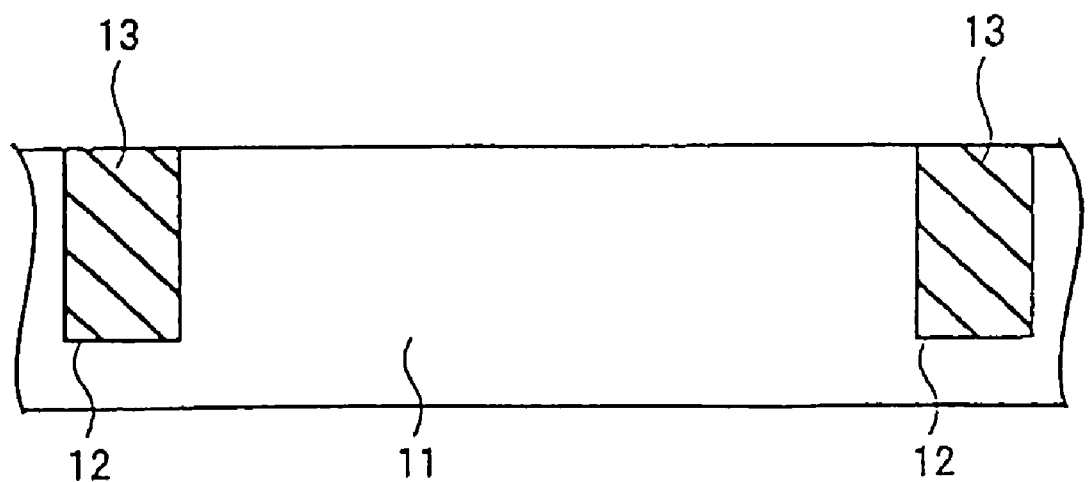
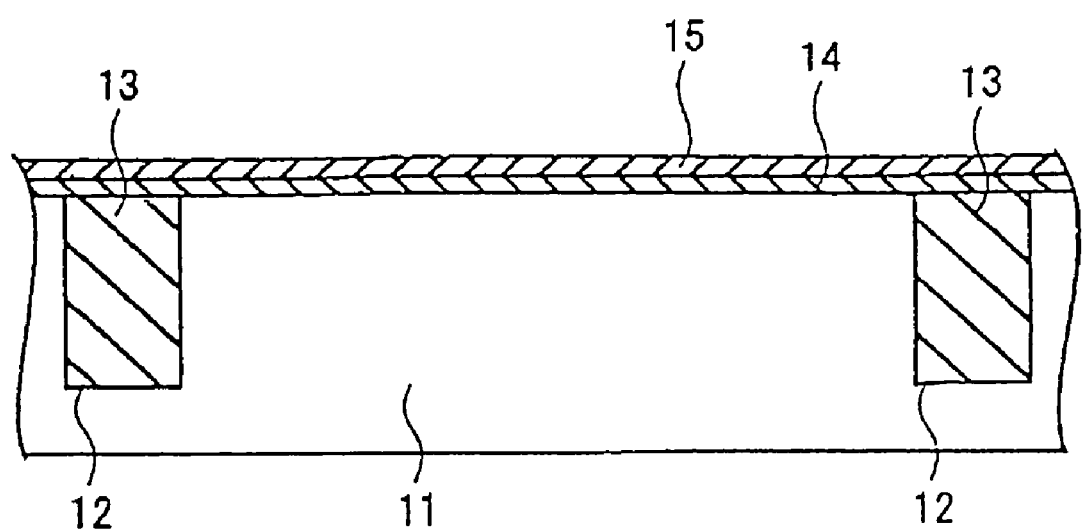
*FIG. 2*

FIG. 3
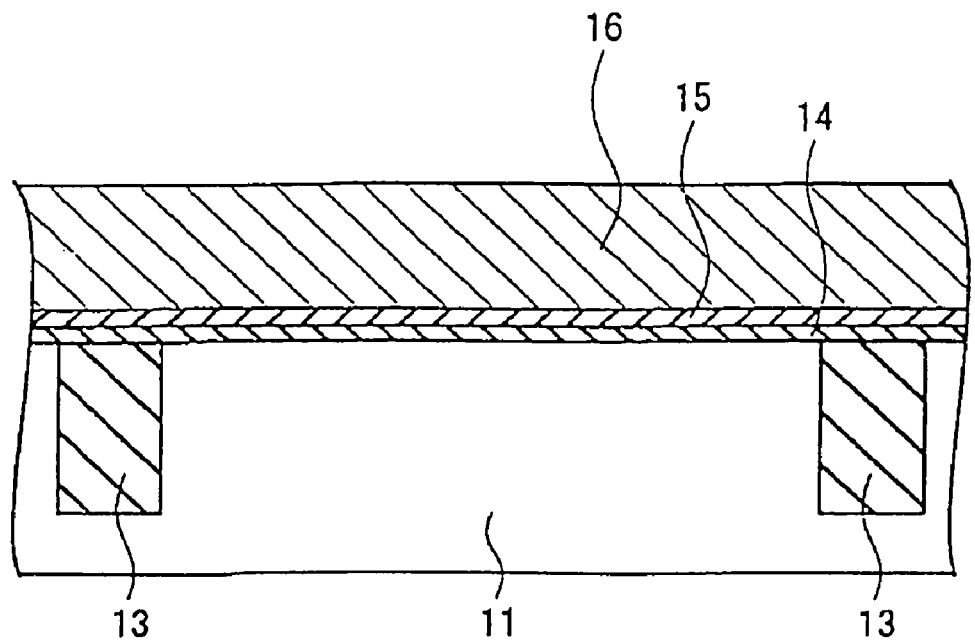
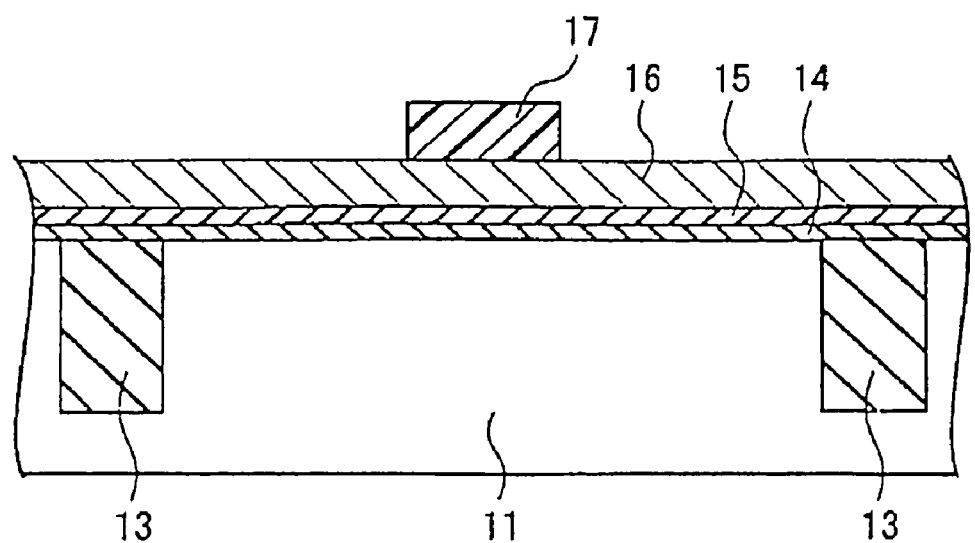
FIG. 4

FIG. 5
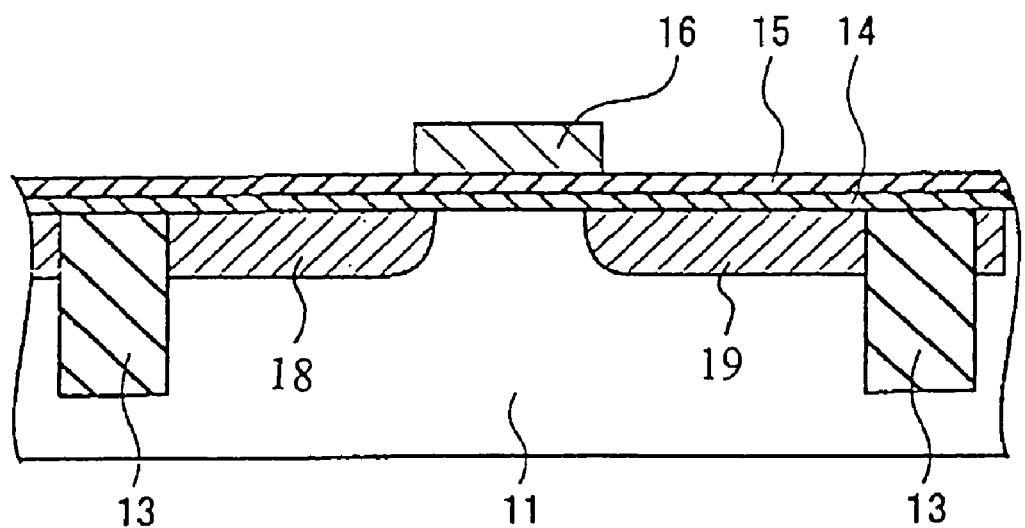
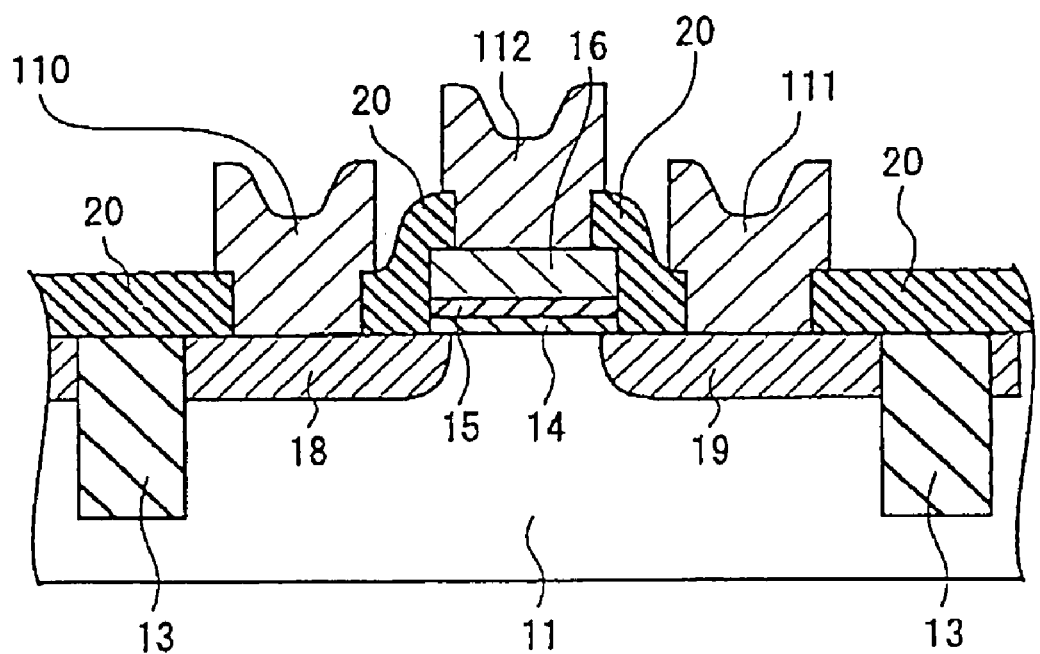
FIG. 6

METHOD OF FORMING SEMICONDUCTOR DEVICE AND SEMICONDUCTOR DEVICE

CROSS-REFERENCE TO RELATED APPLICATIONS

The present application claims priority to Japanese Application No. JP 2002-094150, filed on Mar. 29, 2002, which is hereby incorporated by reference in its entirety.

BACKGROUND OF THE INVENTION

1. Field of the Invention

The present invention relates to a semiconductor device having an improved silicon oxide film as a gate insulation film of a Metal Insulator Semiconductor structure and a method of making the same.

2. Discussion of the Background

With the miniaturization of silicon semiconductor integrated circuits the dimensions of MIS (Metal Insulator Semiconductor) semiconductor devices have also decreased. According to ITRS (International Technology Roadmap for Semiconductors; updated version in 2000), the 100-nm technology node needs a gate insulation film having an equivalent oxide thickness (hereinafter abbreviated EOT) of 1.0 to 1.5 nm. At this film thickness, an insulation film having a higher dielectric constant than those of silicon oxide film and lightly N-doped silicon oxynitride film is necessary to achieve a gate insulation film with suppressed leakage current. Examples of suitable gate insulation films having a high dielectric constant include heavily N-doped silicon oxynitride film, silicon nitride film, and high dielectric metal insulation films of Al-, Zr-, or Hf-based silicates ($AlSiO_x$, $ZrSiO_x$, and $HfSiO_x$).

However, gate insulation films using high-dielectric-constant materials have several associated problems. For example, the nitrogen concentrations near the interfaces of silicon oxynitride film and silicon nitride film increase, thus increasing the interface state density and positive fixed charge density. Accordingly, the transistor's mobility deteriorates. Similarly, increases in the metal densities in Al-, Zr-, and Hf-based silicate films increase the negative fixed charge density near the interfaces, thus also deteriorating the transistor's mobility.

To address these problems, a method of inserting a silicon oxide film into the high-dielectric-constant insulation film/Si interface has been proposed. The insertion of the silicon oxide film attempts to reduce the interface state density at the insulation film/Si interface, thereby moving fixed charges away from the Si substrate and suppressing mobility deterioration. However, when the oxide film thickness exceeds 1 nm, the dielectric constant of the whole film inevitably decreases. Therefore, there remains a critical need for a method of forming an ultrathin (<1 nm), homogeneous (>8 inches), high-quality, silicon oxide film.

In an effort to satisfy this need, the following three procedures have been proposed to form an ultrathin silicon oxide film prior to the formation of a high-dielectric-constant insulation film.

Low-Temperature Oxidation (including radical processes)
Modification of chemical oxide formed by pretreatment
Rapid Thermal Oxidation (RTO)

However, these proposed procedures also have problems.

With respect to the low-temperature oxidation procedure, the density of the formed film is low, which reduces the reliability against electrical stresses. In the radical oxidation procedure, the in-plane uniformity deteriorates under the influence of the distribution of oxygen radicals and variations in the oxygen radical lifetimes.

In the modification of chemical oxide procedure, the annealing step results in film thinning due to the low oxygen partial pressure utilized. Moreover, SiO desorption from the interface produces pinholes, and thus film nonuniformity.

With respect to the RTO, the initial oxidation rate is high and, therefore, it is difficult to control the film thickness in thin-film regions of less than 1 nm. Furthermore, $SiO_2$/Si interfaces formed at a reduced pressure give rise to rough and nonuniform films. In this thermal oxidation procedure, SiO desorption ($Si+SiO_2 \rightarrow 2SiO\uparrow$) occurs at the $SiO_2$/Si interface. It is also theoretically expected that release of Si (or SiO gas) from a Si substrate to an oxide film occurs during initial oxidation of the Si surface (H. Kageshima et al., *Jpn. J. Appl. Phys.* 38, L971 (1999)). It is known that this Si (SiO) diffuses through the oxide film and becomes a source of interface state densities and fixed charges (Takakuwa et al., *Formation, Characterization, and Reliability of Ultrathin Silicon Oxides* (4th Workshop), JSAP Catalog No. AP992204, 99 (1999)).

It has been confirmed that during annealing of an oxide film even under a high vacuum, pinholes are formed in the oxide film, the interface is roughened, and the amount of sub-oxides in an incompletely oxidized state increases (J. V. Seiple et al., *J. Vac. Sci. Technol.* A13(3), 772 (1995) and N. Miyata et al., *J. Appl. Phys.* 74(8), 15, 5275 (1993)).

It can be seen from the foregoing that an optimum range of oxidizing species partial pressures and oxidation temperatures that suppresses both growth of silicon oxide film and SiO desorption is very narrow. This is a great impediment to application to a production line.

Therefore, there remains a critical need for a high throughput method of forming an ultrathin (<1 nm), homogeneous (>8 inches), high-quality, silicon oxide film, which is amenable to large scale production.

SUMMARY OF THE INVENTION

If the oxygen partial pressure is too high during the formation of an ultrathin silicon oxide film used as a high-dielectric-constant insulation film/Si interface layer, the silicon oxide film thickness easily increases. Such an increase is undesirable for the interface layer of the high-dielectric-constant insulation film. Conversely, if oxidation is performed in an ambient with a low oxygen partial pressure, SiO desorbs from the interface, thus deteriorating the interface and increasing in-plane variations. Furthermore, low-temperature oxidation leads to a decrease of the film density. Deterioration of the in-plane uniformity is unavoidable in spite of radical oxidation.

Therefore, it is an object of the present invention to provide a semiconductor device and a method of forming an ultrathin silicon oxide film having a high film density and excellent in-plane uniformity by suppressing interface roughening occurring during high-temperature oxidation and thermal treatment.

In one embodiment of the present invention is a method of forming a semiconductor device by forming a layered gate insulation film, having a dielectric constant higher than that of silicon oxide, on a silicon oxide film. In this embodiment, the oxidation temperature exceeds 650° C. during formation of the silicon oxide film and either He or Ne is added to the oxidation ambient.

In another embodiment of the present invention, the sum of the partial pressures of oxygen and water vapor contained in the oxidation ambient is preferably in excess of 133×

$10^{11.703-18114/T}$ Pa, where T is the thermal treatment temperature expressed in Kelvin (Centigrade+273.15).

In another embodiment of the present invention is a second method of forming a semiconductor device by forming a layered gate insulating film, which has an insulation film having a dielectric constant higher than that of a silicon oxide film, on the silicon oxide film. In this embodiment, the silicon oxide film is formed by solution treatment, the silicon oxide film is thermally processed above 650° C., and either He or Ne is added to the thermal treatment ambient.

In yet another embodiment of the present invention is a semiconductor device that has a layered gate insulation film having an insulation film on a silicon oxide film, where the insulation film has a dielectric constant higher than that of the silicon oxide film and at least a part of the silicon oxide film uses an insulation film containing either He or Ne.

In yet another embodiment of the present invention is a third method forming a semiconductor device. The method includes forming a silicon oxynitride film on a silicon substrate; and annealing the silicon oxynitride film at a temperature in an oxidation ambient, wherein the temperature is 650° C. or more and wherein the oxidation ambient comprises oxygen, water vapor, and either helium or neon. The sum of the oxygen and water vapor partial pressures in the ambient is not more than $133 \times 10^{11.703-18114/T}$ Pa, where T is expressed in Kelvin. The silicon oxynitride film forms a gate insulation layer.

The third method may further include forming a high dielectric insulation film on the silicon oxynitride film. The high dielectric insulation film may have a dielectric constant greater than that of the silicon oxynitride film, and the high dielectric insulation film and the silicon oxynitride film may form a gate insulation layer.

According to the present invention, in a step of previously forming an interface oxide film of high-dielectric-constant insulation film/silicon oxide film/Si substrate structure, interface roughening during high-temperature oxidation and thermal treatment is suppressed. This makes it possible to form an interface oxide film having a high film density and excellent in-plane uniformity. Thus, a low power-consumption, high-speed, reliable MIS semiconductor device can be offered.

The above objects highlight certain aspects of the invention. Additional objects, aspects and embodiments of the invention are found in the following detailed description of the invention.

BRIEF DESCRIPTION OF THE FIGURES

A more complete appreciation of the invention and many of the attendant advantages thereof will be readily obtained as the same becomes better understood by reference to the following Figures in conjunction with the detailed description below.

FIG. 1 is a cross-sectional view showing a formation step for an n-type MOS transistor according to a first embodiment of the present invention;

FIG. 2 is a cross-sectional view showing a formation step for an n-type MOS transistor according to the method of the first embodiment of the present invention;

FIG. 3 is a cross-sectional view showing a formation step for an n-type MOS transistor according to the method of the first embodiment of the present invention;

FIG. 4 is a cross-sectional view showing a formation step for an n-type MOS transistor according to the method of the first embodiment of the present invention;

FIG. 5 is a cross-sectional view showing a formation step for an n-type MOS transistor according to the method of the first embodiment of the present invention;

FIG. 6 is a cross-sectional view showing a formation step for an n-type MOS transistor according to the method of the first embodiment of the present invention;

DETAILED DESCRIPTION OF THE INVENTION

Figure 7:
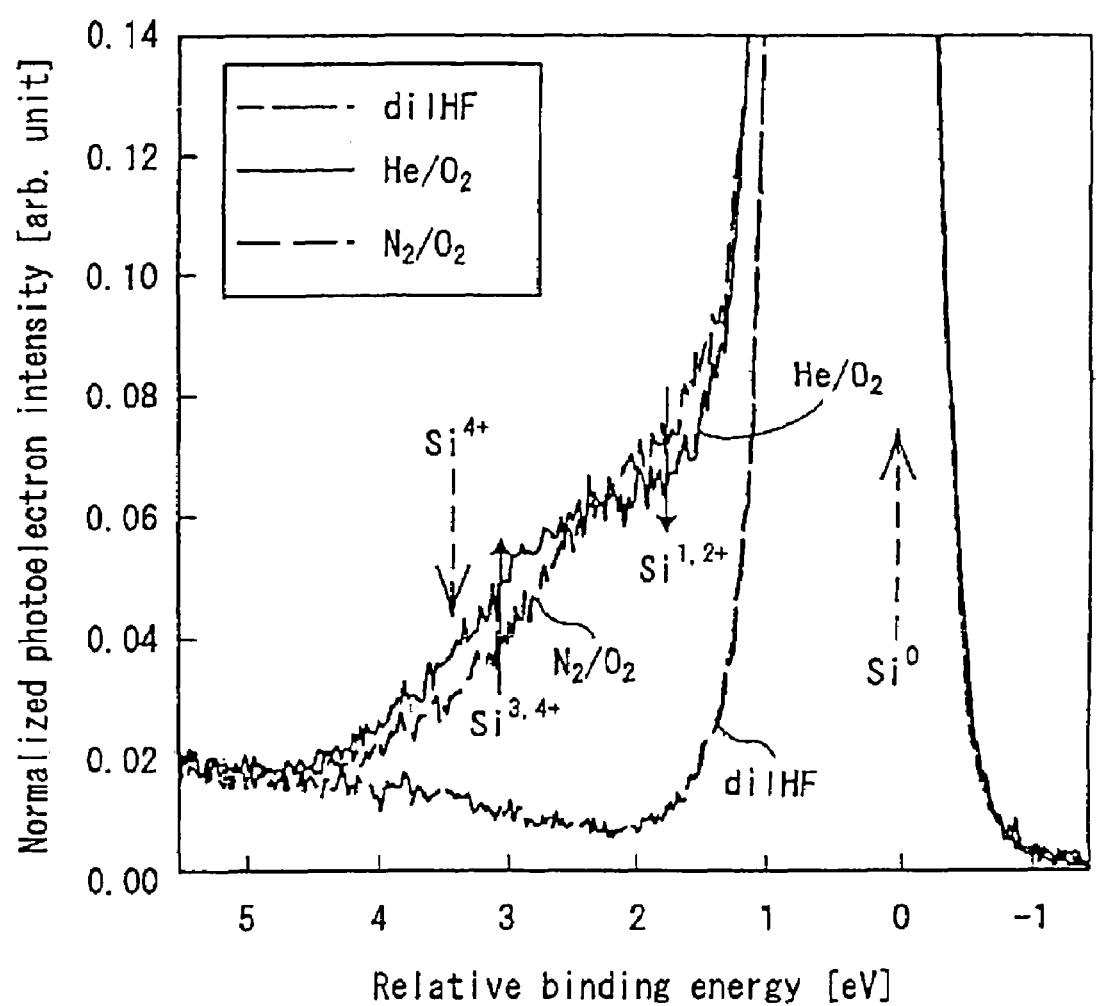
FIG. 7 is a diagram showing changes in $Si_{2p}$ spectrum under various oxidation conditions according to the first embodiment of the invention.

Referring now to the drawings, wherein like reference numerals designate identical or corresponding parts throughout the several views, the present invention will be described.

Unless specifically defined, all technical and scientific terms used herein have the same meaning as commonly understood by a skilled artisan in microfabrication and semiconductor manufacturing.

All methods and materials similar or equivalent to those described herein can be used in the practice or testing of the present invention, with suitable methods and materials being described herein. All publications, patent applications, patents, and other references mentioned herein are incorporated by reference in their entirety. In case of conflict, the present specification, including definitions, will control. Further, the materials, methods, and examples are illustrative only and are not intended to be limiting, unless otherwise specified.

As a first embodiment of the present invention, a description is made while taking formation of a MOS transistor as an example.

First, a deep trench 12 is formed in a surface of a single-crystal p-type silicon substrate 11 of FIG. 1. This is filled up with a silicon oxide film by a CVD method. A device isolation region 13 serving a role of device isolation is formed. Then, a $SiO_2$ film 14 and a $ZrSiO_x$ film 15 of FIG. 2 are formed on the surface of the silicon substrate 11. The method of forming the $SiO_2$ film and $ZrSiO_x$ film will be described in detail hereinbelow.

Subsequently, a polysilicon film 16 is formed on the $ZrSiO_x$ film 15 of FIG. 3 by a CVD method and a photoresist pattern 17 is formed on the polysilicon 16 of FIG. 4.

Using the photoresist pattern 17 as a mask, the polysilicon film 16 is then reactive ion etched, thus forming first gate electrode 16 of FIG. 5. Ions of arsenic are subsequently implanted under suitable conditions, for example, of an accelerating voltage of about 40 keV and a dose of about $2 \times 10^{15}$ $cm^{-2}$. As a result of activation annealing, heavily doped $n^+$-type gate electrode 16, $n^+$-type source region 18, and $n^+$-type drain region 19 are formed simultaneously.

A silicon oxide film of about 300 nm is deposited over the whole surface previously formed by a CVD method. Thereafter, a photoresist pattern (not shown) for forming contact holes is formed on the silicon oxide film. Using this as a mask, the silicon oxide film is etched by a reactive ion etching method. Thus, the contact holes are opened in an interlayer dielectric film 20 of FIG. 6. Finally, an Al film is formed over the whole surface by a sputtering method. The Al film is patterned to form a source electrode 110, a drain electrode 111, and a second gate electrode 112. Consequently, an n-type MOS transistor is completed.

In the presently described embodiment above, formation steps for the n-type MOS transistor are shown. The formation steps for a p-type MOS transistor are similar; only the difference is that the conductivity types are interchanged between n and p types.

With respect to the formation steps for the $SiO_2$ film 14 and $ZrSiO_x$ film 15, a hydrochloric acid-ozone water treatment was used as a pretreatment step to effectively remove surface contamination of the silicon substrate 11. As a result, a chemical oxide of an approximate thickness of 1 nm was formed on the silicon substrate surface. Then, to reduce EOT, the chemical oxide was removed by diluted hydrofluoric acid (dilHF) treatment and the dangling bonds of the Si surface were terminated with hydrogen atoms. After the end of these pretreatments, the wafer was conveyed into a vacuum system and oxidized. At this time, the oxidation conditions were as follows:

Background degree of vacuum: $133 \times 5.4 \times 10^{-10}$ Pa
He partial pressure: 133 Pa
Oxygen partial pressure: $133 \times 10^{-6}$ Pa
Substrate temperature: 700° C.

After forming a $SiO_2$ film 14 of about 0.6 nm, the wafer was carried into a sputter chamber. The temperature of the wafer was maintained at room temperature. Sputtering was performed with an $Ar/O_2$ gas RF plasma (400 W) using a $ZrSi_2$ target. A $ZrSiO_x$ film 15 of about 2 nm was formed on the $SiO_2$ film 14.

The film quality of the ultrathin silicon oxide film formed by the He-added oxidation was analyzed by in-situ X-ray Photoelectron Spectroscopy (hereinafter referred to as in-situ XPS).

FIG. 7 shows variations in $Si_{2p}$ spectrum when the substrate temperature was 700° C. and 10-min $He/O_2$ ($1/1\times10^{-7}$ Torr) oxidation was performed. To see variations in the amount of sub-oxides more easily, the oxygen partial pressure was lowered to $1\times10^{-7}$ Torr, and the formed $SiO_2$ film ($Si^{4+}$) was thinned. The vertical axis of FIG. 7 has been normalized with substrate Si peak ($Si^0$). The sub-oxide region (from $Si^0$ to $Si^{4+}$) is shown to be enhanced. In FIG. 7, the two arrows of broken lines indicate the positions of the $Si^0$ and $Si^{4+}$, respectively. In FIG. 7, the arrows of solid lines indicate variations in the binding energy between $Si^{1, 2+}$ and $Si^{3, 4+}$ obtained by He addition. The X-ray source was $AlK\alpha$. The measurement was made at a photoelectron take-off-angle of 45°. For comparison, the results of the hydrogen-terminated Si surface and $N_2/O_2$ oxidation ($1/1\times10^{-7}$ Torr) are also shown in FIG. 7.

It can be seen from FIG. 7 that sub-oxidae components vary more from lower to higher orders in He-added oxidation as compared with $N_2$-added oxidation. That is, in He-added oxidation, the film is modified to a film composition more closely approaching $SiO_2$ film ($Si^{4+}$). Accordingly, the present procedure is effective in forming a low-leakage, ultrathin gate oxide film. It has also been confirmed that similar effects are produced in $He/H_2O$ oxidation or $He/O_2/H_2O$ oxidation with varied oxidizing species.

Figure 8:
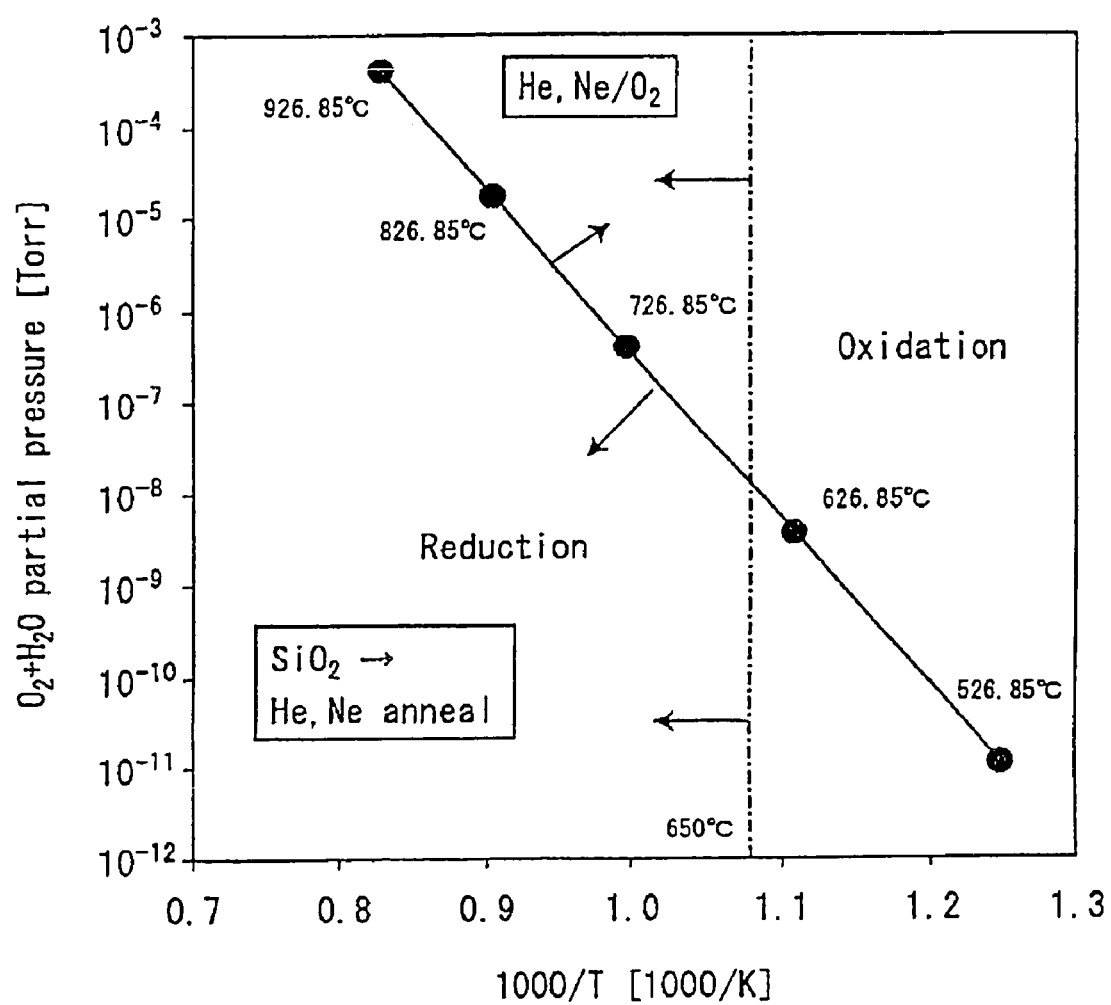
FIG. 8 is a diagram showing the oxidation/reduction boundary of oxidizing species partial pressure against various oxidation temperatures according to the first embodiment of the invention.

Then, the range in which the effects of the He-added oxidation are effective with respect to the oxidizing species partial pressure and heating temperature was confirmed. FIG. 8 shows the oxidation/reduction boundary of oxidizing species partial pressure (the sum of oxygen and water vapor partial pressures) with respect to various oxidation temperatures. The black circles are experimental values of the oxidation/reduction boundary ($Si+SiO_2 \rightarrow 2SiO\uparrow$) at $SiO_2/Si$ interface. The upper side of the solid line is the oxidation region ($SiO_2$ formation region). This is the range in which the oxidizing species partial pressure is more than $133 \times 10^{11.703-11114/T}$ Pa, where T is the above-described thermal treatment temperature expressed in Kelvin. The He-added oxidation of the invention is effective in reducing interface defects in this region.

In a 700° C. oxidation, oxygen partial pressure $1\times10^{-7}$ Torr is the reduction region, while $1\times10^{-6}$ Torr is the oxidation region. Although the oxidation conditions shown in FIG. 7 are $SiO_2/Si$ reduction region, higher-order sub-oxides are formed in $He/O_2$ oxidation. In the other ambients ($N_2$ and ultrahigh vacuum (UHV)), lower-order sub-oxides or a clean Si surface is formed. Therefore, it can be said that He addition is effective in the aforementioned oxidizing species partial pressure range.

The above-described results are described chiefly regarding $ZrSiO_x/SiO_2/Si$ structure. Similar improvement effects have been confirmed regarding $HfSiO_x/SiO_2/Si$ structure and $AlSiO_x/SiO_2/Si$ structure.

Then, a temperature range in which the He-added oxidation can be applied was confirmed. Evaluation of $SiO_2/Si$ interface using electron spin resonance (hereinafter referred to as ESR) shows that the oxidation temperature at which dangling bonds increase at the $SiO_2/Si$ interface is more than 650° C. and so a maximum effect is produced by adding He in oxidation at higher than 650° C. with respect to suppressing SiO desorption (modification of the film) accompanying bond-breaking.

Due to the foregoing, it follows that the oxidation conditions under which He addition produces the maximum effect is the range where the substrate temperature is more than 650° C. (the region to the left of the vertical broken line in FIG. 8) and the oxidizing species partial pressure is more than $133 \times 10^{11.703-18114/T}$ Pa, where T is the above-described thermal treatment temperature (K: Kelvin) (the region on the upper side of the solid line connecting the black circles in FIG. 8).

Figure 9A:
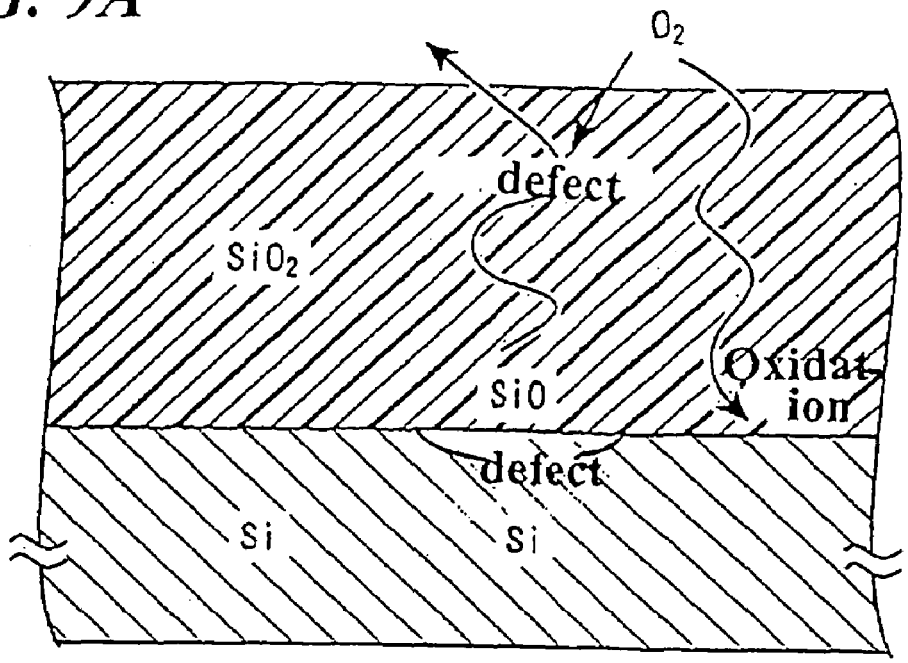
FIG. 9 is a view illustrating and comparing the operation of the first embodiment of the invention (FIG. 9B) with the operation of related art (FIG. 9A).
Figure 9B:
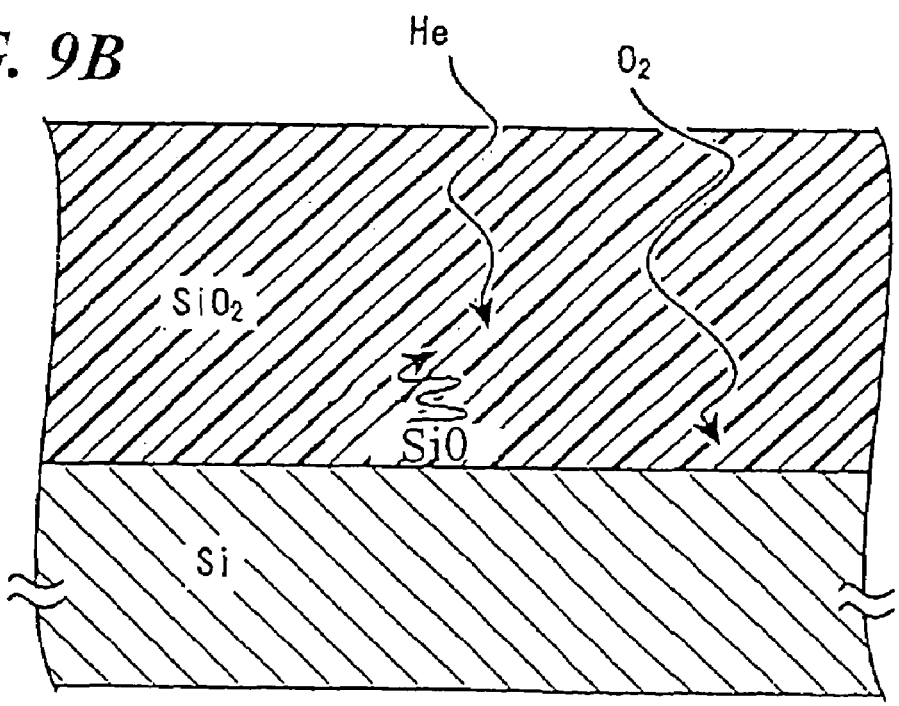

The mechanism of reducing interface defects by He addition is next described using FIGS. 9A and B. In a method in accordance with the related art, a SiO desorption reaction induces increase of interface defects (the space of FIG. 9A) as shown in 9A. Furthermore, recombination of SiO and $O_2$ gas diffusing through $SiO_2$ forms defects also within the film. On the other hand, the method of adding He to an oxidation ambient (FIG. 9B), as in the present invention, is effective in physically suppressing the desorption. This suppression effect arises due to the smaller atomic radius and mass of He compared to nitrogen atoms and thus the diffusion rate within an insulation film is larger, so that He collides against SiO that would diffuse outward. At the same time, He cools thermal vibration of Si—O bond at the $SiO_2/Si$ interface (quench effect) and, consequently, can suppress production of SiO itself. Furthermore, since the atomic radius of He is the smallest in inert gases, the solubility of He in $SiO_2$ is the highest. Hence, diffusion of SiO in $SiO_2$ can be suppressed further by many He atoms embedded in interstices. Moreover, He is an inert gas and so the added gas itself does not induce oxidation or reduction processes. Consequently, the film quality of the gate oxide film is not deteriorated.

In the present invention, results of a case where He gas is used for $O_2$ dilution are chiefly shown. It has been confirmed that similar improvement effects are produced when Ne having an atomic radius smaller than that of nitrogen atoms is used and when their mixture gas is used. Furthermore, the effects are retained where the He or Ne is diluted with nitrogen gas or a rare gas (such as Ar, Kr, or Xe) having an atomic radius larger than that of nitrogen atoms. In addition, the pressure of He or Ne during oxidation is not limited to a redued pressure. The pressure may also be more than 1 atm. Using oxidation under pressure to increase the ratio of He to $O_2$ produces greater effects.

In the present invention, various silicate films/$SiO_2$/Si structures have been principally described. Similar effects are obtained by using silicon oxynitride film or silicon nitride film as the high-dielectric-constant insulation material on the $SiO_2$ film. Moreover, similar effects can also be derived with oxide films, oxynitride films, nitride films, mixture films, and various multilayer films of Al, Zr, and Hf.

In addition, application to a metal insulation film that is more thermally stable than $SiO_2$ film is possible. For example, the invention can be applied to stable metal insulation films such as BeO, MgO, CaO, SrO, BaO, $Y_2O_3$, $CeO_2$, $Pr_xO_y$, $Nd_2O_3$, $ThO_2$, $RuO_2$, $IrO_2$, $In_2O_3$, etc. The invention is also effective for silicate films, oxynitride films, nitride films, mixture films, and various multilayer films of the aforementioned stable metal insulation films. Further, the invention does not depend on the procedure of forming these metal insulation films. Similar effects can be produced with metal insulation films formed by other than sputtering such as ALCVD (atomic layer CVD), evaporation, and plasma CVD.

Since a MOS transistor according to a second embodiment of the invention is similar to the first embodiment, its detailed description is omitted. The present embodiment is different from the first embodiment with respect to the step of forming the interface $SiO_2$ film 14. Accordingly, this step is described in detail using FIG. 2.

First, hydrochloric acid-ozone water treatment was used as a pretreatment to effectively remove surface contamination on the silicon wafer. In this manner a chemical oxide of about 1 nm was formed on the Si surface. The film composition of the silicon oxide film $SiO_x$ formed by solution treatment deviates from $SiO_2$ and has a low film density due to the large amount of hydrogen and water present. In order to promote the desorption of hydrogen and water, as well as densification (modification), for increasing the film density the wafer was conveyed into a vacuum system and postannealed under the following anneal conditions.

Background degree of vacuum: $133 \times 5.4 \times 10^{-10}$ Pa
Ne partial pressure: 133 Pa
Oxygen partial pressure: $133 \times 10^{-7}$ Pa
Substrate temperature: 700° C.

In the Ne annealing of the present embodiment, the film was densified and thinned to about 0.6 nm. After formation of the densified $SiO_2$ film 14, the wafer was carried into a sputter chamber, and a $ZrSiO_x$ film 15 was formed in the same way as in the first embodiment. The Ne annealing conditions of the present embodiment selected the reduction region where the oxidizing species partial pressure is less than $133 \times 10^{11.703-18114/T}$ Pa, where T is the above-described thermal treatment temperature (K: Kelvin) (the region on the lower side of the solid line connecting the black circles) in FIG. 8 according to the first embodiment, for the following reason. Unlike the case of oxidation, an oxide film with some extent of film thickness was already present on the Si surface. To prevent the film thickness from increasing further, it was necessary to select the reduction area. However, UHV or $N_2$ annealing in the reduction region formed pinholes in $SiO_2$ due to SiO desorption from the interface. In the Ne annealing of the present embodiment, desorption and diffusion of SiO from the interface were effectively suppressed in the reduction region owing to the operations described in the first embodiment. Increase of the oxide film thickness and increase of the interface roughness could both be suppressed.

The operations of this sequence of steps are similar to those of the first embodiment. When practiced in accordance with the present invention, every semiconductor step obeys the same concept as described in the first embodiment. Especially among them, in the high-temperature thermal treatment step where $SiO_2$/Si interface is present and the temperature is in excess of 650° C., Ne addition (or more preferably He addition) is effective.

Above described method may also applicable to form a silicon oxynitride film of gate insulation layer. Where the silicon oxynitride film is formed on a silicon substrate and then annealed at a temperature in an oxidation ambient. The annealing temperature is 650° C. or more and the oxidation ambient comprises oxygen, water vapor, and either helium or neon. The sum of the oxygen and water vapor partial pressures in the ambient is not more than $133 \times 10^{11.703-18114/T}$ Pa, wherein T is expressed in Kelvin, and the silicon oxynitride film forms a gate insulation layer.

Further, the method of forming a semiconductor device may further comprise step of forming a high dielectric insulation film on the silicon oxynitride film, where the high dielectric insulation film has a dielectric constant greater than that of the silicon oxynitride film, and the high dielectric insulation film and the silicon oxynitride film form a gate insulation layer. The silicon oxynitride film may include nitrogen of an average density of less than 30 atomic % and the high dielectric insulation film may be silicon oxynitride containing nitrogen of an average density of 30 atomic % or more.

The silicon oxynitride film or silicon oxide film including nitrogen has Si and N atom dangling bonds and strained bonds (K. Muraoka et al., J. Electronchem. Soc., 149(4), F23(2002)). Those dangling bonds and strained bonds may be reduced and the film characteristic may be improved by the annealing step. As such, accurate control of the interface silicon oxide film thickness and decrease of interface defects can both be effectively achieved by adding He or Ne to an ambient of high-temperature oxidation or high-temperature thermal treatment exceeding 650° C. and controlling the oxidizing species partial pressure within the ambient according to the substrate temperature. This control of the process ambient is especially effective where the silicon oxide film thickness is less than about 1 nm. A semiconductor device of the present invention is next described.

In the first and second embodiments, high concentrations of He and Ne are respectively accepted into the interface $SiO_2$ film 14. The He or Ne segregates to the substrate interface, stretching the distorted network and the interface stress is relaxed. Another effect is that thermal vibrations of bonding are cooled down. Also, diffusion of impurities such as hydrogen or boron is prevented. Therefore, interface state densities and fixed charges are reduced. Moreover, the resistance to electrical stresses is high and a reliable gate insulation film can be produced.

In the present invention, He or Ne gas is necessary. Where the rare gases Ar, Xe, or Kr is introduced, the aforementioned effects cannot be expected. However, it is possible to use He or Ne gas in combination with Ar, Xe, or Kr gas.

Also, in the invention, the roughness of metal insulation film/Si substrate interface can be reduced, while the leakage current at this interface can be decreased. Consequently, for example, where a memory function is imparted to a semiconductor device of MIS structure by forming a floating gate in a memory (e.g., a nonvolatile memory, a so-called metal insulation film), substantial effects arise.

As described thus far, according to the various embodiments of the invention, decrease of the roughness of high-dielectric-constant insulation film/silicon oxide film/Si substrate interface and decrease of interface roughness can both be accomplished. Furthermore, low power-consumption, high-speed, reliable MIS semiconductor device can also be offered.

Numerous modifications and variations on the present invention are possible in light of the above teachings. It is, therefore, to be understood that within the scope of the accompanying claims, the invention may be practiced otherwise than as specifically described herein.

The invention claimed is:

1. A semiconductor device comprising:
   a semiconductor substrate;
   a silicon oxide film formed on the semiconductor substrate; and
   a gate insulation layer including a high dielectric insulation film formed on the silicon oxide film and having a greater dielectric constant than that of the silicon oxide film,
   wherein at least one member selected from the group consisting of He and Ne is present in the silicon oxide film and is segregated to a substrate interface of the silicon oxide film.

2. The semiconductor device according to claim 1, wherein the silicon oxide film has a thickness of not more than 1 nm.

3. The semiconductor device according to claim 1, wherein the high dielectric insulation film includes $SiON_x$ or SiN.

4. The semiconductor device according to claim 1, wherein the high dielectric insulation film includes at least one of Al, Zr, and Hf.

* * * * *